(12) United States Patent
Agrawal et al.

(10) Patent No.: US 10,911,162 B1
(45) Date of Patent: Feb. 2, 2021

(54) DIRECT SAMPLING FOR DIGITAL PRE-DISTORTION CALIBRATION

(71) Applicant: SEMICONDUCTOR COMPONENTS INDUSTRIES, LLC, Phoenix, AZ (US)

(72) Inventors: Abhishek Kumar Agrawal, Fremont, CA (US); Hossein Dehghan, Diablo, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/776,840

(22) Filed: Jan. 30, 2020

(51) Int. Cl.
*H04B 17/13* (2015.01)
*H04B 7/0426* (2017.01)
*H03F 1/32* (2006.01)

(52) U.S. Cl.
CPC ........... *H04B 17/13* (2015.01); *H03F 1/3241* (2013.01); *H04B 7/0426* (2013.01)

(58) Field of Classification Search
CPC .................. H03F 1/3241; H04B 17/12; H04B 2001/0491; H04B 17/24; H04B 2001/0425; H04B 1/0475; H04B 2001/0408; H04B 7/0426; H04B 17/21; H04B 17/13; H04B 7/04; H04B 1/02; H04B 1/0458; H04B 7/0413; H04L 27/368
See application file for complete search history.

(56) References Cited

U.S. PATENT DOCUMENTS

| 9,537,519 | B2 * | 1/2017 | El-Hassan | ............. H03F 1/3247 |
| 10,560,140 | B1 * | 2/2020 | Wu | ...................... H04B 7/0413 |
| 2006/0189284 | A1 | 8/2006 | Yamawaki et al. | |
| 2008/0049868 | A1 | 2/2008 | Brobston | |

(Continued)

FOREIGN PATENT DOCUMENTS

WO 2012168801 A1 12/2012

OTHER PUBLICATIONS

Eui-Rim Jeong et al., "A low cost adaptive digital predistorter for linearization of power amplifiers in MIMO transmitters," IEICE Electronics Express, vol. 19, No. 6, 580-585, 2012.

(Continued)

*Primary Examiner* — Khanh C Tran
(74) *Attorney, Agent, or Firm* — Maschoff Brennan

(57) ABSTRACT

A MIMO transceiver may include a communication chain configured to generate a signal at a first frequency. The communication chain may include a pre-distorter configured to accept pre-distortion parameters to pre-distort signals. The communication chain may include a PA to amplify the signals. The MIMO transceiver may include a DPD chain configured to receive the signal at the first frequency. The DPD chain may include a data converter to sample the signal using a sampling rate based on a baseband frequency. The data converter may be configured to generate a sample signal based on the sampling of the signal. The DPD chain may include a buffer configured to buffer the sample signal. The MIMO transceiver may include a DPD circuit configured to calibrate the pre-distortion parameters calibrated based on the buffered sample signal to compensate for non-linearity in amplification provided by the PA of the communication chain.

20 Claims, 8 Drawing Sheets

(56) References Cited

U.S. PATENT DOCUMENTS

| | | | |
|---|---|---|---|
| 2010/0166110 A1* | 7/2010 | Neumann | H04L 27/368 |
| | | | 375/296 |
| 2011/0150130 A1 | 6/2011 | Kenington | |
| 2011/0170630 A1 | 7/2011 | Silverman et al. | |
| 2012/0328050 A1 | 12/2012 | Bai et al. | |
| 2013/0049858 A1 | 2/2013 | Wimpenny | |
| 2013/0052964 A1* | 2/2013 | Husted | |
| 2016/0344483 A1* | 11/2016 | Kareisto | H04B 1/0475 |
| 2018/0092048 A1* | 3/2018 | Cheng | H04B 17/21 |
| 2019/0280730 A1* | 9/2019 | Zhang | H04L 1/243 |
| 2020/0119755 A1* | 4/2020 | Mahmood | H04B 1/04 |

OTHER PUBLICATIONS

Kelly Mekechuk et al., "Linearizing Power Amplifiers Using Digital Predistortion, EDA Tools and Test Hardware," High Frequency Electronics, 7 pages, Apr. 2004.

Luis Carolos Vieira et al. "Experimental demonstration of digital predistortion for orthogonal frequency-division multiplexing-radio over fibre links near laster resonance," IET Journals, IET Optoelectronics, 2015, vol. 9, Iss. 6, pp. 310-316.

* cited by examiner

US 10,911,162 B1

DIRECT SAMPLING FOR DIGITAL PRE-DISTORTION CALIBRATION

FIELD

The implementations discussed in the present disclosure are related to direct sampling for digital pre-distortion calibration.

BACKGROUND

Unless otherwise indicated in the present disclosure, the materials described in the present disclosure are not prior art to the claims in the present application and are not admitted to be prior art by inclusion in this section.

Wireless networks (e.g., wireless local area networks (WLANs) may include a multiple input multiple output (MIMO) transceiver for communicatively coupling computing devices connected to the wireless network to each other and/or providing access to the Internet. The MIMO transceiver may include multiple communication chains for wirelessly receiving signals from and wirelessly transmitting signals to the computing devices. The communication chains may include power amplifiers (PAs) that amplify the corresponding signals prior to transmission. The PAs may provide non-linear amplification of the signals, which may cause distortion in the signals and errors when the signals are received by the computing devices. The non-linearity in amplification provided by the PAs may be compensated for by pre-distorting the signals prior to amplification by the PAs.

The subject matter claimed in the present disclosure is not limited to implementations that solve any disadvantages or that operate only in environments such as those described above. Rather, this background is only provided to illustrate one example technology area where some implementations described in the present disclosure may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

One or more implementations of the present disclosure may include a MIMO transceiver. The MIMO transceiver may be configured for digital pre-distortion (DPD) calibration. The MIMO transceiver may include a first communication chain. The first communication chain may be configured to generate a signal at a first frequency. The first communication chain may include a pre-distorter circuit. The pre-distorter circuit may be configured to accept pre-distortion parameters to pre-distort signals. The first communication chain may also include a PA. The PA may be configured to amplify the signals of the first communication chain. The MIMO transceiver may also include a DPD calibration chain. The DPD calibration chain may be configured to receive the signal at the first frequency. The DPD calibration chain may include a data converter. The data converter may be configured to perform operations including sampling the signal at the first frequency. The signal may be sampled using a sampling rate based on a baseband frequency. The baseband frequency may be lower than the first frequency. The operations may also include generating a sample signal at the baseband frequency. The sample signal may be based on the sampling of the signal. The DPD calibration chain may also include a buffer. The buffer may be configured to buffer the sample signal at the baseband frequency. In addition, the MIMO transceiver may include a DPD circuit. The DPD circuit may be configured to calibrate the pre-distortion parameters. The pre-distortion parameters may be calibrated based on the buffered sample signal to compensate for non-linearity in amplification provided by the PA of the first communication chain.

One or more implementations of the present disclosure may include a method to operate a MIMO transceiver. The MIMO transceiver may be configured for DPD calibration. The method may include generating a signal at a first frequency. The signal may be generated by a first communication chain of the MIMO transceiver. The first communication chain may include a PA. The method may also include sampling the signal at the first frequency. The signal may be sampled by a DPD calibration chain. The signal may be sampled using a sampling rate based on a baseband frequency. The baseband frequency may be lower than the first frequency. In addition, the method may include generating a sample signal at the baseband frequency. The sample signal may be generated based on the sampling of the signal. Further, the method may include buffering the sample signal at the baseband frequency. The method may include calibrating pre-distortion parameters of the first communication chain. The pre-distortion parameters may be calibrated based on the buffered sample signal to compensate for non-linearity in amplification provided by the PA of the first communication chain.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims or may be learned by the practice of the invention as set forth hereinafter.

BRIEF DESCRIPTION OF THE DRAWINGS

To further clarify the above and other advantages and features of the present invention, a more particular description of the invention will be rendered by reference to specific implementations thereof which are illustrated in the appended drawings. It is appreciated that these drawings depict only example implementations of the invention and are therefore not to be considered limiting of its scope. The invention will be described and explained with additional specificity and detail through the use of the accompanying drawings in which.

DETAILED DESCRIPTION OF SOME EXAMPLE IMPLEMENTATIONS

Figure 1:
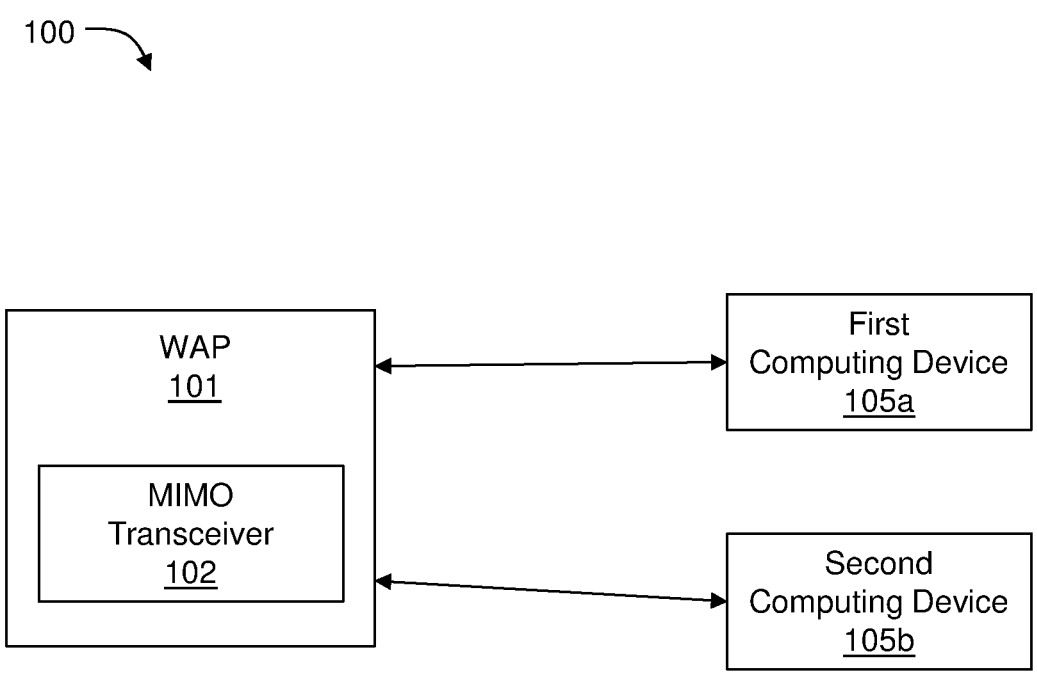
FIG. 1 illustrates an example environment in which a wireless access point (WAP) with a MIMO transceiver may be implemented.

Wireless networks (e.g., WLANs) may include multiple wireless nodes or devices that wirelessly communicate with each other. In an example implementation, the nodes may include a WAP, a relay, one or more STAs, and/or other wireless nodes. Each WAP, STA, and/or other wireless node may include a MIMO transceiver to send and/or receive wireless communications. Each MIMO transceiver may include multiple communication chains to permit simultaneous wireless communication between the MIMO transceiver and other wireless devices.

Each communication chain may include a receive portion configured to wirelessly receive and process signals from other wireless devices. In addition, each communication chain may include a transmit portion configured to process and amplify signals prior to transmission. In addition, the transmit portions may include non-ideal components that cause distortion of signals that are transmitted by the corresponding communication chains. For example, the transmit portions may include a PA that provides non-linear amplification of a power level of the signals prior to transmission. The non-linearity of amplification provided by the PAs may cause distortion in the signals. The distortion may degrade signal quality and reduce data rates of the corresponding signals.

The non-linearity in amplification provided by the PAs may be compensated for by performing DPD calibration and DPD application for one or more of the communication chains. DPD calibration may include calibrating pre-distortion parameters based on the non-linearity in amplification provided by the PAs. In addition, DPD application may include pre-distorting the signals (e.g., the signals may be pre-distorted prior to amplification by the PAs) based on the pre-distortion parameters. In some implementations, the signals may be pre-distorted in an opposite direction of the non-linear amplification provide by the PA to cause power levels of the signals, after amplification, to approach expected power levels.

In some implementations, the MIMO transceiver may include a DPD circuit configured to observe the amplification of the PAs. In these implementations, the DPD circuit may calibrate the pre-distortion parameters based on the observed amplification by the PAs. To perform DPD, MIMO transceivers may include one or more dedicated DPD calibration chains for observing the amplification provided by the PAs. In some DPD technologies, the DPD calibration chains may receive signals for performing DPD of a corresponding communication chain. The DPD calibration chains may receive the signals at a first frequency. In addition, the DPD calibration chains may downconvert the signals to a baseband frequency, which may be lower than the first frequency. In some DPD technologies, to downconvert the signals to the baseband frequency, the DPD calibration chains may include various components such as mixers, subtractors, and filters.

These DPD technologies may cause a circuit footprint of the MIMO transceiver to be large due to the inclusion of the components for downconverting the signals. For example, each of the mixers, the subtractors, and the filters may increase a circuit footprint of the DPD calibration chains. Further, these DPD technologies may increase a cost of producing the MIMO transceiver due to a cost of components in the dedicated DPD calibration chains. For example, each of the mixers, the subtractors, and the filters increase the cost of producing the MIMO transceiver.

Some implementations described in the present disclosure may permit DPD to be performed for the communication chains of the MIMO transceiver without downconverting signals. In some implementations, the first communication chain may generate a signal at a first frequency after amplification by the corresponding PA. The DPD calibration chain may receive the signal at the first frequency.

The DPD calibration chain may include a data converter that samples the signal at the first frequency using a sampling rate based on the baseband frequency. For example, the data converter may implement sub-sampling, down-sampling, decimation or any other appropriate form of sampling a signal at the first frequency using the sampling rate based on the baseband frequency. Sampling the signal at the sampling rate based on the baseband frequency may cause the data converter to generate a sample signal at the baseband frequency based on portions of the signal within different signal periods of the signal.

The DPD calibration chain may buffer the sample signal at the baseband frequency. The DPD circuit may calibrate the pre-distortion parameters based on the sample signal buffered by the second communication chain. The pre-distortion parameters may be calibrated based on the non-linearity in amplification provided by the PA.

Some implementations described in the present disclosure may reduce the circuit footprint of the MIMO transceiver due to the fact that the DPD calibration chains do not include components for downconverting the signals. In addition, some implementations described in the present disclosure may reduce the cost of producing the MIMO transceiver since the mixers, the subtractors, and the filters may not be included in the MIMO transceiver. In addition, some implementations described in the present disclosure may improve calibration of the pre-distortion parameters by eliminating insertion loss of the components in the dedicated DPD calibration chains.

These and other implementations of the present disclosure will be explained with reference to the accompanying figures. It is to be understood that the figures are diagrammatic and schematic representations of such example implementations, and are not limiting, nor are they necessarily drawn to scale. In the figures, features with like numbers indicate like structure and function unless described otherwise.

FIG. 1 illustrates an example environment 100 in which a WAP 101 with a MIMO transceiver 102 may be implemented, in accordance with at least one implementation disclosed in the present disclosure. The environment 100 (e.g., an operational environment) may also include a first computing device 105a and a second computing device 105b (referenced collectively in the present disclosure as "computing devices 105"), each of which may include or be implemented as a STA.

The WAP 101 and the computing devices 105 may create a wireless network. In some implementations, the WAP 101 may provide access to the Internet for the computing devices 105. Example computing devices 105 may include personal computers, printers, televisions, digital video disc (DVD) players, security cameras, smartphones, tablets, smart devices, or any other appropriate computing device configured for wireless communication. Accordingly, each of the computing devices 105 may include a MIMO transceiver similar to the MIMO transceiver 102. In some implementations, the MIMO transceivers of the computing devices 105 may implement DPD calibration and DPD application as described herein.

The MIMO transceiver 102 of the WAP 101 may include multiple communication chains (not illustrated in FIG. 1) to allow simultaneous communication between the MIMO transceiver 102 and both of the computing devices 105. For example, the first computing device 105a may transmit signals to and receive signals from a first communication chain of the MIMO transceiver 102. As another example, the second computing device 105 may transmit signals to and receive signals from a second communication chain of the MIMO transceiver 102. The MIMO transceiver 102 may include four, eight, twelve or any other appropriate number of communication chains. The communication chains of the MIMO transceiver 102 are discussed in more detail below in relation to FIGS. 2-4, and 6.

Each communication chain may include a transmit portion. The transmit portion may perform functions associated with transmitting the signals to the computing devices 105. The transmit portions may include non-ideal components that cause distortion of the signals. For example, each of the transmit portions may include a PA that provides non-linear amplification of a power level of the corresponding signals. The non-linearity of amplification provided by the PAs may cause distortion in the signals. The distortion of the signals may degrade signal quality and reduce data rates of the corresponding signals.

The MIMO transceiver 102 may include one or more DPD calibration chains (not illustrated in FIG. 1) to perform DPD calibration using direct sampling. The MIMO transceiver 102 may perform DPD calibration and DPD application to compensate for the non-linearity in amplification provided by the PAs. DPD calibration may include calibrating pre-distortion parameters based on the non-linearity in amplification provided by the PAs. In addition, DPD application may include pre-distorting the signals (e.g., the signals may be distorted prior to amplification by the PAs) based on the pre-distortion parameters. Each DPD calibration chain may receive signals for performing DPD from the communication chains. The DPD calibration chains of the MIMO transceiver 102 are discussed in more detail below in relation to FIGS. 2-4 and 6.

Figure 2:
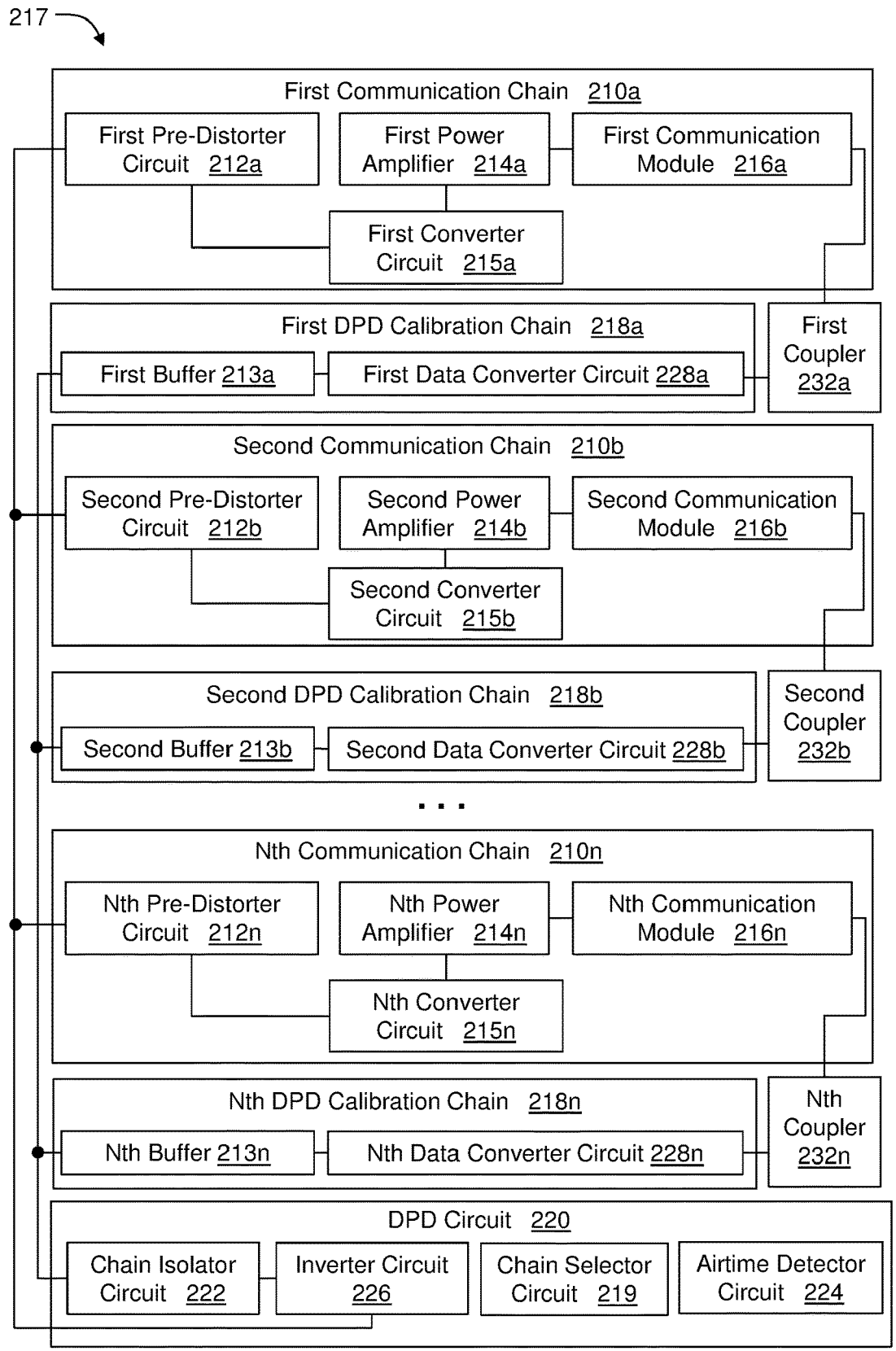
FIG. 2 illustrates an example MIMO transceiver that may be implemented in the environment of FIG. 1.

FIG. 2 illustrates an example MIMO transceiver 217 that may be implemented in the environment 100 of FIG. 1, in accordance with at least one implementation disclosed in the present disclosure. The MIMO transceiver 217 may correspond to the MIMO transceiver 102 of FIG. 1. For example, the MIMO transceiver 217 may be configured to perform DPD calibration using direct sampling.

The MIMO transceiver 217 may include a DPD circuit 220 and two or more communication chains. In the illustrated implementation, the MIMO transceiver 217 includes a first communication chain 210a, a second communication chain 210b, and a $N^{th}$ communication chain 210n (referenced collectively in the present disclosure as "communication chains 210"). As indicated by the ellipsis and the $N^{th}$ communication chain 210n in FIG. 2, the MIMO transceiver 217 may include any appropriate number of communication chains 210.

The MIMO transceiver 217 may also include a first DPD calibration chain 218a, a second DPD calibration chain 218b, and a $N^{th}$ DPD calibration chain 218n (referenced collectively in the present disclosure as "DPD calibration chains 218"). As indicated by the ellipsis and the $N^{th}$ DPD calibration chain 218n in FIG. 2, the MIMO transceiver 217 may include any appropriate number of DPD calibration chains 218. Further, the MIMO transceiver 217 may include a first coupler 232a, a second coupler 232b, and a $N^{th}$ coupler 232n (referenced collectively in the present disclosure as "couplers 232"). As indicated by the ellipsis and the $N^{th}$ coupler 232n in FIG. 2, the MIMO transceiver 217 may include any appropriate number of couplers 232.

The first communication chain 210a may include a first PA 214a. The second communication chain 210b may include a second PA 214b. The first PA 214a and the second PA 214b may provide non-linear amplification of signals to be transmitted by the corresponding communication chains 210. To compensate for the non-linear amplification, DPD calibration and DPD application may be performed for one or more of the communication chains 210. In some implementations, compensating for non-linear amplification of a signal may include one or a combination of two or more of the following: pre-distorting the signal, pre-distorting the signal by adding an inverse of the non-linearity to the signal, pre-distorting the signal by introducing inverse distortion into the signal, correcting gain and phase distortions in the signal, or canceling intermodulation products in the signal.

In some implementations, DPD calibration may be performed before, during, or after operation of the MIMO transceiver 217. For example, DPD calibration may be performed during installation of the MIMO transceiver 217 in the environment 100. As another example, DPD calibration may be performed after an interval of time has elapsed since DPD calibration was last performed.

In some implementations, after the interval of time has elapsed, an airtime detector circuit 224 may determine whether communication is occurring between one or more of the communication chains 210 and the computing devices 105. For example, in some implementations, the airtime detector circuit 224 may determine if the transmit portions of the communication chains 210 are transmitting and/or if the receive portions of the communication chains 210 are receiving. In some implementations, if communications are occurring, the MIMO transceiver 217 may wait for the communications to end before performing DPD calibration. Alternatively, in some implementations, the airtime detector circuit 224 may determine whether the communications are below a communication threshold before the MIMO transceiver 217 performs DPD calibration. For example, the airtime detector circuit 224 may determine if a receive signal strength on one or more receive portions of the communication chains 210 from the computing devices 105 is below a threshold value such that the signals being received by the receive portions will not interfere with signals being wirelessly transmitted by the transmit portions of the communication chains 210. The threshold value may be determined by subtracting a signal to interference requirement programmed on the DPD circuit 220 from an expected receive signal strength of a signal wirelessly transmitted (e.g., coupled over the air) between the transmit portions and the receive portions of the communication chains. As yet another example, DPD calibration may be performed only during specified periods of time (e.g., between the hours of ten PM and seven AM).

An example of DPD calibration and DPD application that involves the first communication chain 210a and the first DPD calibration chain 218a will now be discussed. The first communication chain 210a may include one or more of a first pre-distorter circuit 212a, the first PA 214a, a first converter circuit 215a, and/or a first communication module 216a. The first DPD calibration chain 210a may include one or more of a first data converter circuit 228a and/or a first buffer 213a. The first pre-distorter circuit 212a may accept first pre-distortion parameters to pre-distort signals prior to transmission by the first communication module 216a. In addition, the first PA 214a may amplify the signals prior to transmission by the first communication module 216a.

The first communication chain 210a may generate a first signal at a first frequency. In some implementations, the first frequency may include a frequency within a RF band. The first PA 214a may amplify a power level of the first signal from an initial power level to an amplified power level. The first communication module 216a may receive the first signal at the first frequency and the amplified power level.

In some implementations, the first coupler 232a may couple the first communication chain 210a to the first DPD calibration chain 218a. For example, the first coupler 232a may couple the first communication module 216a to the first data converter circuit 228a. The couplers 232 may each include a radio frequency (RF) coupler or any other appropriate frequency band coupler. In some implementations, a variable attenuator (not illustrated in FIG. 2) may be coupled between the first coupler 232a and the first data converter circuit 228a. In these and other implementations, the variable attenuator may receive the first signal at the first frequency and the amplified power level from the first coupler 232a. The variable attenuator may variably reduce a power level of the first signal at the first frequency to an intermediate power level.

The first data converter circuit 228a may receive the first signal at the first frequency and the intermediate power level via the first coupler 232a.

The first data converter circuit 228a may collect a sample of a first portion of the first signal within a signal period of the signal. The first data converter circuit 228a may increment a sample point to collect a sample of a second portion of the first signal within a subsequent period of the first signal. This process may be repeated until samples of each portion of the first signal can be folded together to represent an entire cycle of the first signal. In some implementations, this process may be repeated to generate a single sample signal at the baseband frequency and the amplified power level that includes multiple cycles generated in this manner.

In some implementations, the signal period may correspond to a bandwidth of a waveform of the signal. In these and other implementations, the signal period may correspond to two, four, or any other appropriate multiple of the bandwidth of the waveform. Additionally or alternatively, the signal period may be determined based on the baseband frequency. Sampling of signals for performing DPD calibration is discussed in more detail below in relation to FIGS. 5A and 5B. The first buffer 213a may receive and buffer the first sample signal at the baseband frequency and the amplified power level.

The DPD circuit 220 may include a chain isolator circuit 222 and an inverter circuit 226. The chain isolator circuit 222 may receive the first sample signal at the baseband frequency and the amplified power level from the first buffer 213a (e.g., receive a buffered sample signal at the first frequency). The chain isolator circuit 222 may also receive the first signal at the baseband frequency and the initial power level. The chain isolator circuit 222 may provide the first signal at the baseband frequency and the initial power level to the inverter circuit 226. In addition, the chain isolator circuit 222 may provide the first sample signal at the baseband frequency and the amplified power level to the inverter circuit 226.

The inverter circuit 226 may calibrate the first pre-distortion parameters based on the first sample signal received from the second buffer 213b. The first pre-distortion parameters may be calibrated to compensate for the non-linearity in amplification of the first signal provided by the first PA 214a. For example, in some implementations, the first pre-distortion parameters may be calibrated as an additive inverse of the non-linearity in amplification provided by the first PA 214a.

In some implementations, the inverter circuit 226 may determine a difference between the first sample signal at the baseband frequency and the amplified power level and an expected signal at the baseband frequency and an expected power level. For example, a value of the power level of the first sample signal may be subtracted from a value of the power level of the expected signal to determine the difference between the amplified power level and the expected power level. The expected power level in this and other implementations may be stored in memory (e.g., in a table of input power levels and expected output power levels), calculated on the fly (e.g., based on a desired linear relationship between input power level and expected output power level), or determined or obtained in some other manner. The inverter circuit 226 may calibrate the first pre-distortion parameters based on the difference between the amplified power level and the expected signal.

In some implementations, the inverter circuit 226 may generate the expected signal by scaling the first signal at the baseband frequency prior to amplification by the first PA 214a to the expected power level.

In some implementations, the inverter circuit 226 may compare the first sample signal at the baseband frequency and the amplified power level to the first signal at the baseband frequency and the initial power level. For example, a value of the power level of the first signal at the initial power level may be subtracted from a value of the power level of the first sample signal at the amplified power level to determine a difference between the amplified power level and the initial power level. The initial power level in this and other implementations may be measured on the fly or determined or obtained in some other manner. A difference between the amplified power level and the initial power level may be determined. The difference between the amplified power level and the initial power level may be compared to a level of amplification expected to be provided by the first PA 214a. The inverter circuit 226 may calibrate the first pre-distortion parameters based on the difference between the amplified power level and the initial power level compared to the level of amplification expected to be provided by the first PA 214a.

The inverter circuit 226 may provide the first pre-distortion parameters to the first pre-distorter circuit 212a. The first pre-distorter circuit 212a may pre-distort subsequent signals transmitted by the first communication module 216a based on the first pre-distortion parameters. In some implementations, the pre-distorter circuit 212a may pre-distort subsequent signals by correcting gain and phase distortions, canceling intermodulation products, or both correcting gain and phase distortions and canceling intermodulation products. Alternatively or additionally, the first pre-distorter circuit 212a may pre-distort the subsequent signals equal to the additive inverse of the non-linearity in amplification provided by the first PA 214a. More generally, the pre-distorter circuit 212a may pre-distort the subsequent signals by introducing inverse distortion into the subsequent signals. The pre-distortion of the subsequent signals may cause the subsequent signals to be more linear when received by the computing devices 105. The first converter circuit 215a may upconvert the subsequent signals from the baseband frequency to the first frequency.

An example of DPD calibration and DPD application that involves the second communication chain 210b and the second DPD calibration chain 218b will now be discussed. The second communication chain 210b may include one or more of a second pre-distorter circuit 212b, the second PA 214b, a second converter circuit 215b, and/or a second communication module 216b. The second DPD calibration chain 210b may include one or more of a second data converter circuit 228b and/or a second buffer 213b. The second pre-distorter circuit 212b may accept second pre-distortion parameters to pre-distort signals prior to transmission by the second communication module 216b. In addition, the second PA 214b may amplify the signals prior to transmission by the second communication module 216b.

In some implementations, the DPD circuit 220 may also include a chain selector circuit 219. The chain selector circuit 219 may selectively control which of the communication chains 210 generate corresponding signals for performing DPD calibration. In these and other implementations, the chain selector circuit 219, responsive to calibration of the first pre-distortion parameters, may provide a control signal to the communication chains 210. The control signal may indicate that the first communication chain 210a is to stop generating the first signal. In addition, the control signal may indicate that the second communication chain 210b is to start generating a second signal at the first frequency.

The second communication chain 210b may generate the second signal at the first frequency. The second PA 214b may amplify the power level of the second signal at the first frequency to the amplified power level. The second communication module 216b may receive the second signal at the amplified power level from the second PA 214b.

In some implementations, the second coupler 232b may couple the second communication chain 210b to the second DPD calibration chain 218b. For example, the second coupler 232b may couple the second communication module 216b to the second data converter circuit 228b. In some implementations, another variable attenuator (not illustrated in FIG. 2) may be coupled between the second coupler 232b and the second data converter circuit 228b. The variable attenuator may receive the second signal at the first frequency and the amplified power level from the second coupler 232b. The variable attenuator may variably reduce a power level of the second signal at the first frequency to the intermediate power level.

The second DPD calibration chain 218b may receive the second signal at the first frequency and the intermediate power level via the second coupler 232b.

The second data converter circuit 228b may generate a second sample signal at the baseband frequency and the amplified power level in the same or similar manner as discussed above in relation to the first sample signal. The second buffer 213b may receive and buffer the second sample signal at the baseband frequency and the amplified power level.

The chain isolator circuit 222 may receive the second sample signal at the baseband frequency and the amplified power level from the second buffer 213b. The chain isolator circuit 222 may also receive the second signal at the baseband frequency and the initial power level (e.g., prior to amplification by the second PA 214b). The chain isolator circuit 222 may provide the second signal at the baseband frequency and the initial power level to the inverter circuit 226. In addition, the chain isolator circuit 222 may provide the second sample signal at the baseband frequency and the amplified power level to the inverter circuit 226.

The inverter circuit 226 may calibrate the second pre-distortion parameters to compensate for non-linearity in amplification of the second signal provided by the second PA 214b. The inverter circuit 226 may calibrate the second pre-distortion parameters in the same or similar manner as discussed above in relation to the first pre-distortion parameters. In addition, the second pre-distorter circuit 212b may pre-distort subsequent signals transmitted by the second communication module 216b based on the second pre-distortion parameters in the same or similar manner that the first pre-distorter circuit 212a pre-distorts subsequent signals to be transmitted by the first communication module 216a based on the first pre-distortion parameters.

In some implementations, responsive to calibration of one or more of the pre-distortion parameters, the MIMO transceiver 217 may verify performance of DPD calibration and DPD application for the corresponding communication chains 210. In these and other implementations, one or more link parameters for the corresponding communication chains 210 may be determined. The link parameters post performance of DPD calibration and DPD application may be compared to the corresponding link parameters prior to performance of DPD calibration and DPD application. The link parameters may include an error vector magnitude (EVM), a modulation coding schema (MCS), an output power level on the corresponding PAs 214, or any other appropriate link parameter.

In some implementations, the communication chains 210, in addition to generating and transmitting signals for performing DPD calibration, may transmit signals representative of data to be provided to the computing devices 105. For example, the first PA 214a may amplify signals representative of the data and the first communication module 216a may wirelessly transmit the signals representative of the data to the computing devices 105.

The receive portions of the communication chains 210 may be linear receivers. Specific example components of the receive portions are discussed in more detail below in relation to FIG. 6. The receive portions being configured as linear receivers may permit the various signals to propagate through the components within the receive portions without introducing insertion loss or distortion.

In some implementations, an optimal communication chain of the communication chains 210 may be selected for performing DPD calibration based on one or more corresponding link parameters. For example, in some implementations, the optimal communication chain 210 may be selected based on the EVM, the MCS, the output power level on the corresponding PA 214, or any other appropriate link parameter. In some implementations, DPD calibration for the optimal communication chain may be performed and the pre-distortion parameters that are calibrated for the optimal communication chain may be used for each of the communication chains 210. For example, the first pre-distortion parameters may be provided to the second pre-distorter circuit 212*b* and the third pre-distorter circuit 212*c* to pre-distort the second signal and the third signal, respectively.

FIG. 2 illustrates an implementation of the MIMO transceiver 217 with multiple communication chains 210 and DPD calibration chains 218. In another implementation, the MIMO transceiver 217 may include exactly one communication chain 210 and one DPD calibration chain 218. In such an implementation, the chain isolator circuit 222 may be omitted from the DPD circuit 220. Alternatively or additionally, the chain isolator circuit 222 may be omitted from the DPD circuit 220 where the MIMO transceiver 217 includes two or more communication chains 210 and where the MIMO transceiver 217 operates the communication chains 210 one at a time, together with a corresponding DPD calibration chain 218 during DPD calibration.

Figure 3:
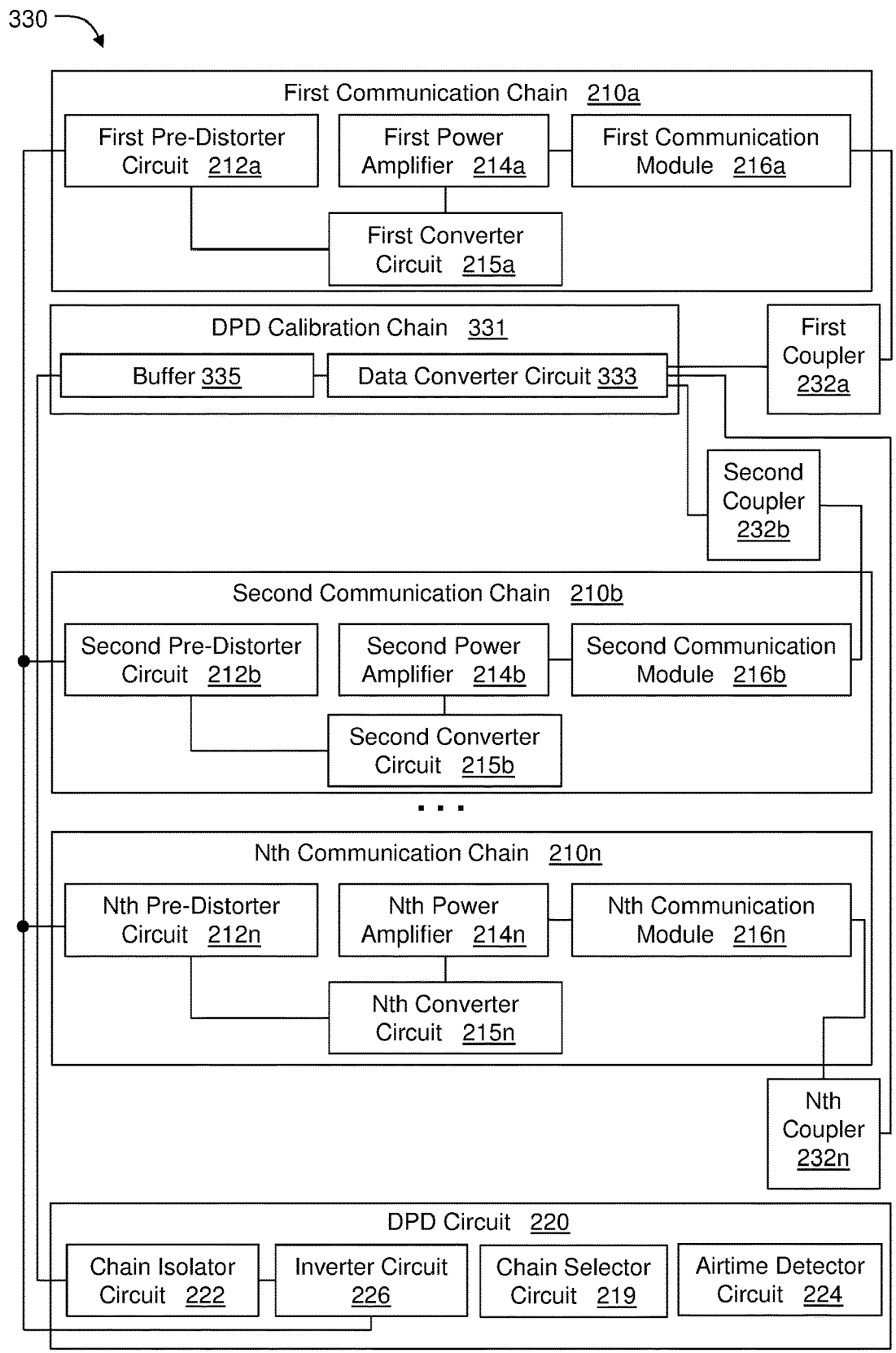
FIG. 3 illustrates another example MIMO transceiver that may be implemented in the environment of FIG. 1.

FIG. 3 illustrates another example MIMO transceiver 330 that may be implemented in the environment 100 of FIG. 1, in accordance with at least one implementation disclosed in the present disclosure. The MIMO transceiver 330 may correspond to the MIMO transceiver 102 of FIG. 1. The MIMO transceiver 330 may include the communication chains 210. As indicated by the ellipsis and the $N^{th}$ communication chain 210*n* in FIG. 3, the MIMO transceiver 330 may include any appropriate number of communication chains 210.

The MIMO transceiver 330 may include a DPD calibration chain 331. The DPD calibration chain 331 may receive signals for performing DPD calibration from each of the communication chains 210. For example, the DPD calibration chain 331 may receive the first signal and the second signal at the first frequency and the amplified power level via the couplers 232. As indicated by the ellipsis and the $N^{th}$ coupler 232*n* in FIG. 3, the MIMO transceiver 330 may include any appropriate number of couplers 232.

An example of DPD calibration and DPD application that involves the first communication chain 210*a* and the DPD calibration chain 331 of FIG. 3 will now be discussed. The first communication chain 210*a* may generate the first signal at the first frequency. The first PA 214*a* may amplify the power level of the first signal from the initial power level to the amplified power level. The first communication module 216*a* may receive the first signal at the first frequency and the amplified power level.

In some implementations, the first coupler 232*a* may couple the first communication chain 210*a* to the DPD calibration chain 331. For example, the first coupler 232*a* may couple the first communication module 216*a* to the data converter circuit 333 of the DPD calibration chain 331. In some implementations, a variable attenuator (not illustrated in FIG. 3) may be coupled between the first coupler 232*a* and the data converter circuit 333. The variable attenuator may receive the first signal at the first frequency and the amplified power level from the first coupler 232*a*. The variable attenuator may reduce the power level of the first signal at the first frequency to the intermediate power level.

The data converter circuit 333 may receive the first signal at the first frequency and the intermediate power level via the first coupler 232*a*.

The data converter circuit 333 may generate the first sample signal at the baseband frequency and the amplified power level in the same or similar manner as discussed above in relation to the first data converter circuit 228*a* of FIG. 2. The buffer 335 may receive and buffer the first sample signal at the baseband frequency and the amplified power level.

The chain isolator circuit 222 may receive the first sample signal at the baseband frequency and the amplified power level from the buffer 335. The chain isolator circuit 222 may also receive the first signal at the baseband frequency and the initial power level (e.g., prior to amplification by the first PA 214*a*). The chain isolator circuit 222 may provide the first signal at the baseband frequency and the initial power level to the inverter circuit 226. In addition, the chain isolator circuit 222 may provide the first sample signal at the baseband frequency and the amplified power level to the inverter circuit 226. The inverter circuit 226 may calibrate the first pre-distortion parameters in the same or similar manner as the first pre-distortion parameters discussed above in relation to FIG. 2.

An example of DPD calibration and DPD application that involves the second communication chain 210*b* and the DPD calibration chain 331 will now be discussed. The chain selector circuit 219, responsive to calibration of the first pre-distortion parameters, may provide a control signal to the communication chains 210. The control signal may indicate that the first communication chain 210*a* is to stop generating the first signal. In addition, the control signal may indicate that the second communication chain 210*b* is to start generating the second signal at the first frequency.

The second communication chain 210*b* may generate the second signal at the first frequency. The second PA 214*b* may amplify the power level of the second signal at the first frequency to the amplified power level. The second communication module 216*b* may receive the second signal at the amplified power level from the second PA 214*b*.

In some implementations, the second coupler 232*b* may couple the second communication chain 210*b* to the DPD calibration chain 331. For example, the second coupler 232*b* may couple the second communication module 216*b* to the data converter circuit 333. In some implementations, another variable attenuator (not illustrated in FIG. 3) may be coupled between the second coupler 232*b* and the data converter circuit 333. The variable attenuator may receive the second signal at the first frequency and the amplified power level from the second coupler 232*b*. The variable attenuator may variably reduce the power level of the second signal at the first frequency to an intermediate power level.

The DPD calibration chain 331, and specifically the data converter circuit 333, may receive the second signal at the first frequency and the intermediate power level via the second coupler 232*b*.

The data converter circuit 333 may generate the second sample signal at the baseband frequency and the amplified power level in the same or similar manner as discussed above in relation to the first sample signal generated by the first data converter circuit 228*a* of FIG. 2. The buffer 335 may receive and buffer the second sample signal at the baseband frequency and the amplified power level.

The chain isolator circuit 222 may receive the second sample signal at the baseband frequency and the amplified power level from the buffer 335. The chain isolator circuit 222 may also receive the second signal at the baseband frequency and the initial power level (e.g., prior to amplification by the second PA 214*b*). The chain isolator circuit 222 may provide the second signal at the baseband frequency and the initial power level to the inverter circuit 226. In addition, the chain isolator circuit 222 may provide the second sample signal at the baseband frequency and the amplified power level to the inverter circuit 226. The inverter circuit 226 may calibrate the second pre-distortion parameters in the same or similar manner as the first pre-distortion parameters discussed above in relation to FIG. 2.

In some implementations, the chain isolator circuit 222 may receive a combined signal from the DPD calibration chain 331. The combined signal may include a combination of two or more of the first signal, the second signal, or any other signal at the first frequency for performing DPD calibration. The chain isolator circuit 222 may isolate the different signals included in the combined signal. In some implementations, the combined signal may be used to simultaneously perform DPD calibration for two or more communication chains 210. In other implementations, the combined signal may be used to perform DPD calibration for a subsequent communication chain without stopping transmission of the signal of the communication chain 210 that was previously having DPD calibration performed for. For example, if DPD calibration for the first communication chain 210a was previously being performed and DPD calibration for the second communication chain 210b is to be performed, the chain isolator circuit 222 may permit the first communication chain 210a to continue transmitting the first signal while the second communication chain 210b transmits the second signal.

To isolate the different signals, the chain isolator circuit 222 may monitor the different signals at the initial power levels. In addition, the chain isolator circuit 222 may scale the various signals from the initial power levels and subtract the scaled signals from the combined signal except for the scaled signal corresponding to the communication chain 210 that DPD calibration is being performed for (e.g., may generate a subtracted signal). The chain isolator circuit 222 may provide the subtracted signal to the inverter circuit 226. The inverter circuit 226 may calibrate the corresponding pre-distortion parameters using the subtracted signal in the same or similar manner as calibrating the first pre-distortion parameters using the first signal discussed above relation to FIG. 2.

FIG. 3 illustrates an implementation of the MIMO transceiver 330 with multiple communication chains 210. In another implementation, the MIMO transceiver 330 may include exactly one communication chain 210. In such an implementation, the chain isolator circuit 222 may be omitted from the DPD circuit 220. Alternatively or additionally, the chain isolator circuit 222 may be omitted from the DPD circuit 220 where the MIMO transceiver 330 includes two or more communication chains 210 and where the MIMO transceiver 330 operates the communication chains 210 one at a time during DPD calibration.

Figure 4:
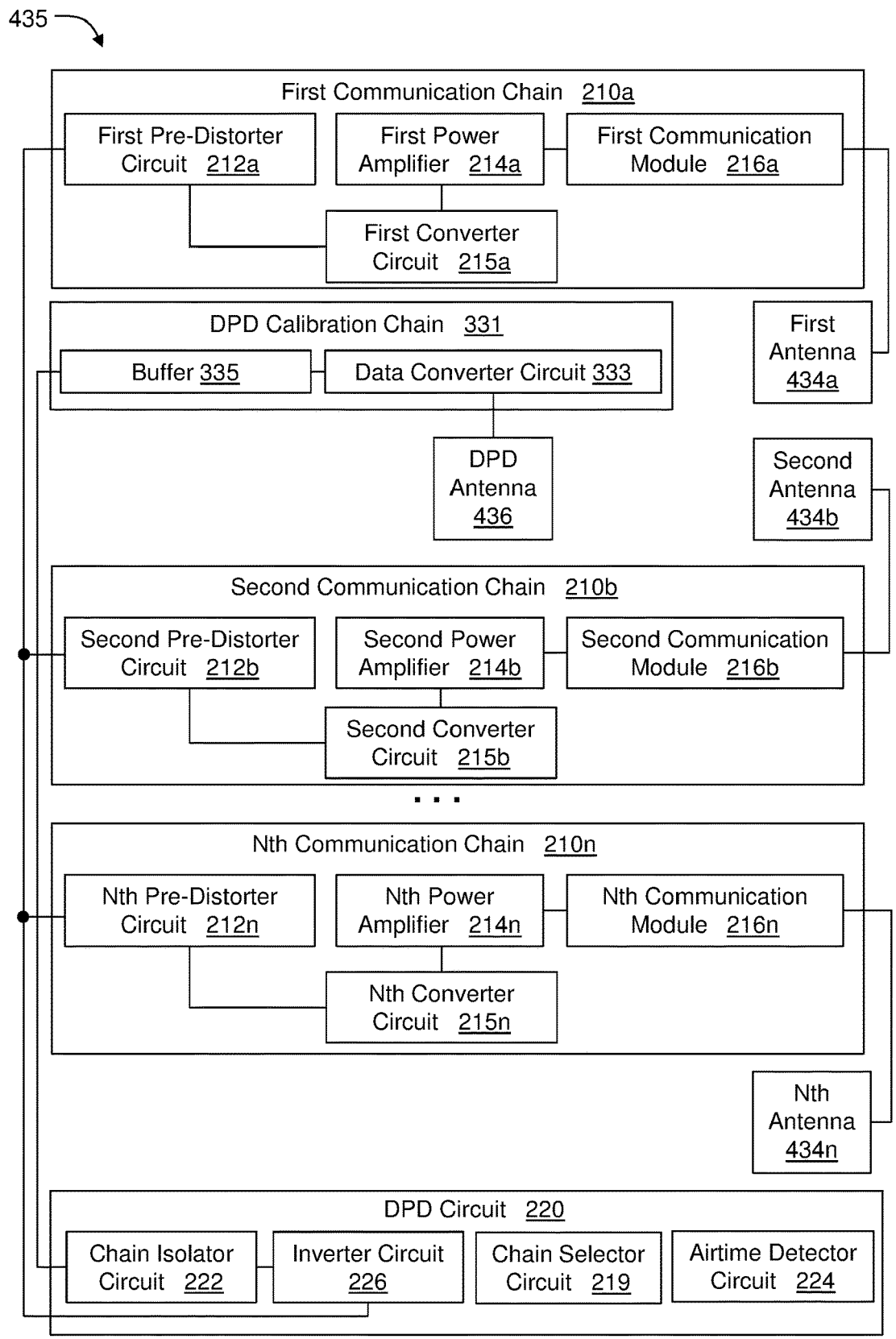
FIG. 4 illustrates yet another example MIMO transceiver that may be implemented in the environment of FIG. 1.

FIG. 4 illustrates yet another example MIMO transceiver 435 that may be implemented in the environment 100 of FIG. 1, in accordance with at least one implementation disclosed in the present disclosure. The MIMO transceiver 435 may correspond to the MIMO transceiver 102 of FIG. 1. The MIMO transceiver 435 may include the communication chains 210. As indicated by the ellipsis and the $N^{th}$ communication chain 210n in FIG. 4, the MIMO transceiver 435 may include any appropriate number of communication chains 210.

The MIMO transceiver 435 may also include the DPD calibration chain 331. The MIMO transceiver 435 may include a first antenna 434a, a second antenna 434b, and a $N^{th}$ antenna 434n (referenced collectively in the present disclosure as "antennas 434"). As indicated by the ellipsis and the $N^{th}$ antenna 434n in FIG. 4, the MIMO transceiver 435 may include any appropriate number of antennas 434. The first antenna 434a may be coupled to the first communication chain 210a. In addition, the second antenna 434b may be coupled to the second communication chain 210b. The MIMO transceiver may include a DPD antenna 436 coupled to the DPD calibration chain 331. In some implementations, the DPD antenna 436 may couple the first antenna 434a and the second antenna 434b to the DPD calibration chain 331 using over-the-air (OTA) coupling.

In some implementations, the first antenna 434a may receive the first signal at the first frequency and the amplified power level from the first communication module 216a. The first antenna 434a may wirelessly transmit the first signal at the first frequency and the amplified power level. The DPD antenna 436 may wirelessly receive the first signal at the first frequency and the amplified power level. The data converter circuit 333 may receive the first signal at the first frequency and the amplified power level from the DPD antenna 436. The DPD calibration chain 331 may generate the first sample signal based on the first signal received from the DPD antenna 436 in the same or similar manner as discussed above in relation to FIG. 2.

In some implementations, the second antenna 434b may receive the second signal at the first frequency and the amplified power level from the second communication module 216b. The second antenna 434b may wirelessly transmit the second signal at the first frequency and the amplified power level. The DPD antenna 436 may wirelessly receive the second signal at the first frequency and the amplified power level. The data converter circuit 333 may receive the second signal at the first frequency and the amplified power level from the DPD antenna 436. The DPD calibration chain 331 may generate the second sample signal based on the second signal received from the DPD antenna 436 in the same or similar manner as discussed above in relation to FIG. 2.

In some implementations, the DPD antenna 436 may wirelessly receive the combined signal at the first frequency and the amplified power level. The data converter circuit 333 may receive the combined signal at the first frequency and the amplified power level from the DPD antenna 436. The DPD calibration chain 331 may generate the first sample signal and/or the second sample signal based on the combined signal received from the DPD antenna 436 in the same or similar manner as discussed above in relation to FIG. 2.

FIG. 4 illustrates an implementation of the MIMO transceiver 435 with multiple communication chains 210. In another implementation, the MIMO transceiver 435 may include exactly one communication chain 210. In such an implementation, the chain isolator circuit 222 may be omitted from the DPD circuit 220. Alternatively or additionally, the chain isolator circuit 222 may be omitted from the DPD circuit 220 where the MIMO transceiver 435 includes two or more communication chains 210 and where the MIMO transceiver 435 operates the communication chains 210 one at a time during DPD calibration.

Figure 5A:
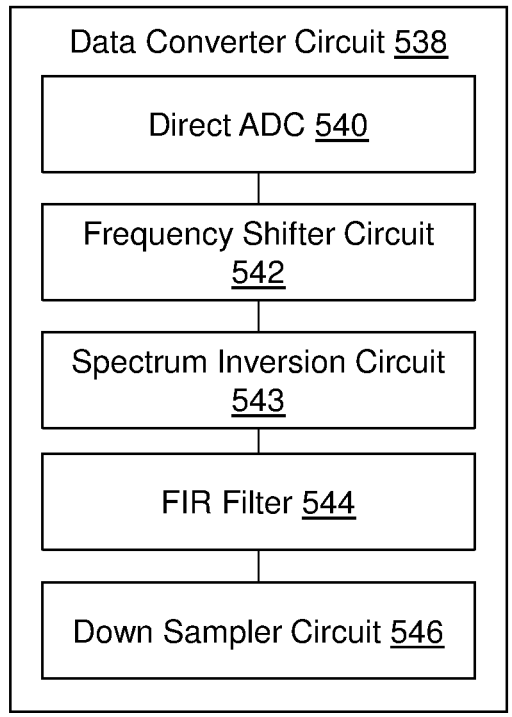
FIG. 5A illustrates an example data converter circuit that may be implemented in the MIMO transceiver of FIG. 1.

FIG. 5A illustrates an example data converter circuit 548 that may be implemented in the MIMO transceiver 102 of FIG. 1, in accordance with at least one implementation disclosed in the present disclosure. The data converter circuit 548 may correspond to the data converter circuits 228 and 333 of FIGS. 2-4. The data converter circuit 548 may include one or more of a direct analog to digital converter (ADC) 540, a frequency shifter circuit 542, a spectrum inversion circuit 543, a finite impulse response (FIR) filter 544, and/or a down sampler circuit 546.

The direct ADC 540 may receive the calibration signals at the first frequency. For example, the direct ADC 540 may receive the first signal and the second signal at the first frequency. In some implementations, the direct ADC 540 may receive the calibration signals at the first frequency and the amplified power level. In other implementations, the direct ADC 540 may receive the calibration signals at the first frequency and the intermediate power level.

The direct ADC 540 (e.g., a direct first frequency ADC) may convert the calibration signals from analog signals to digital signals. For example, the direct ADC 540 may sample the calibration signals using the sampling rate based on the baseband frequency. The direct ADC 540 may collect the sample of the first portion of the calibration signals within the signal period of the calibration signals. The direct ADC 540 may increment the sample point to collect the sample of the second portion of the calibration signals within the subsequent period of the calibration signals. This process may be repeated until samples of each portion of the calibration signals can be folded together to represent the entire cycle of the calibration signals. The direct ADC 540 may generate the sample signals based on the sampling of the calibration signals as digital signals at an intermediate frequency.

In some implementations, the sampling rate may be determined based on a Nyquist requirement of the calibration signals and corresponding harmonics generated by the non-linearity of the power amplifier 214. For example, if the calibration signals include a bandwidth of eighty MHz at frequency of 5,500 MHz, an overall distorted signal bandwidth of the calibration signal may be two hundred forty MHz if a third order nonlinearity is considered. In this example, a minimum sampling rate may be 240 MHz. In some implementations, the sampling rate may be increased to ensure samples of the entire signals are obtained within a single Nyquist zone.

The frequency shifter circuit 542 may be communicatively coupled to the direct ADC 540. The frequency shifter circuit 542 may receive the sample signals at the intermediate frequency as digital signals. The frequency shifter circuit 542 may shift a carrier frequency component of the sample signals. For example, the frequency shifter circuit 542 may shift the sample signals to the baseband frequency.

In some implementations, the spectrum inversion circuit 543 may be communicatively coupled to the frequency shifter circuit 542. The spectrum inversion circuit 543 may receive the sample signal at the baseband frequency. The spectrum inversion circuit 543 may compensate for spectral inversion that occurs within the frequency shifter circuit 542 if a band of the sampling signal is in an even Nyquist zone. In some implementations, the spectrum inversion circuit 543 circuit may be omitted.

The FIR filter 544 may be communicatively coupled to the spectrum inversion circuit 543. The FIR filter 544 may receive the sample signals at the baseband frequency. The FIR filter 544 may filter out portions of the sample signals at the baseband frequency. For example, the FIR filter 544 may filter out of band portions out of the sample signals.

The down sampler circuit 546 may be communicatively coupled to the FIR filter 544. The down sampler circuit 546 may down sample the sample signals at the baseband frequency (e.g., may decimate the sample signals to obtain an orthogonal frequency-division multiplexing (OFDM) signal). In some implementations, the down sampler circuit 546 may down sample the sample signals at the baseband frequency to a Nyquist sampling rate. In these and other implementations, the Nyquist sampling rate may be based on the baseband frequency or the first frequency.

Figure 5B:
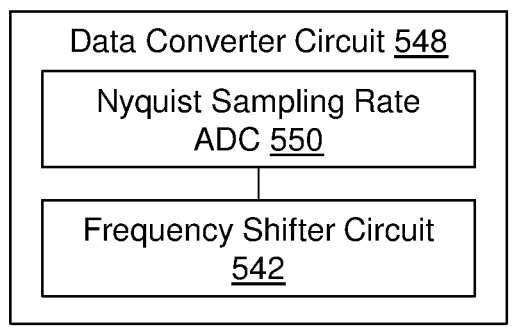
FIG. 5B illustrates another example data converter circuit that may be implemented in the MIMO transceiver of FIG. 1.

FIG. 5B illustrates another example data converter circuit 548 that may be implemented in the MIMO transceiver 102 of FIG. 1, in accordance with at least one implementation disclosed in the present disclosure. The data converter circuit 548 may correspond to the data converter circuits 228 and 333 of FIGS. 2-4. The data converter circuit 548 may include one or more of a Nyquist sampling rate ADC 550 and/or the frequency shifter circuit 542.

The Nyquist sampling rate ADC 550 may convert the calibration signals from analog signals to digital signals. For example, the Nyquist sampling rate ADC 550 may sample the calibration signals using the sampling rate based on the baseband frequency. In some implementations, the Nyquist sampling rate ADC 550 may sample the calibration signals at the Nyquist sampling rate. In these and other implementations, the Nyquist sampling rate may be based on the baseband frequency or the first frequency. The Nyquist sampling rate ADC 550 may alias the calibration signals at the first frequency to the sample signals at the intermediate frequency. In some implementations, the Nyquist sampling rate ADC 550 may alias the calibration signals to obtain the OFDM signal. Aliasing refers to signal distortion and spectral folding caused by sampling rates lower than a Nyquist rate requirement of a signal at RF frequencies. In at least some implementations described herein, aliasing is used intentionally to create low-frequency aliases of loopback signal leveraging the band-pass nature of the signal.

The frequency shifter circuit 542 may receive the sample signals at the intermediate frequency as digital signals. The frequency shifter circuit 542 may shift the carrier frequency component of the sample signals. For example, the frequency shifter circuit 542 may shift the sample signals to the baseband frequency.

Figure 6:
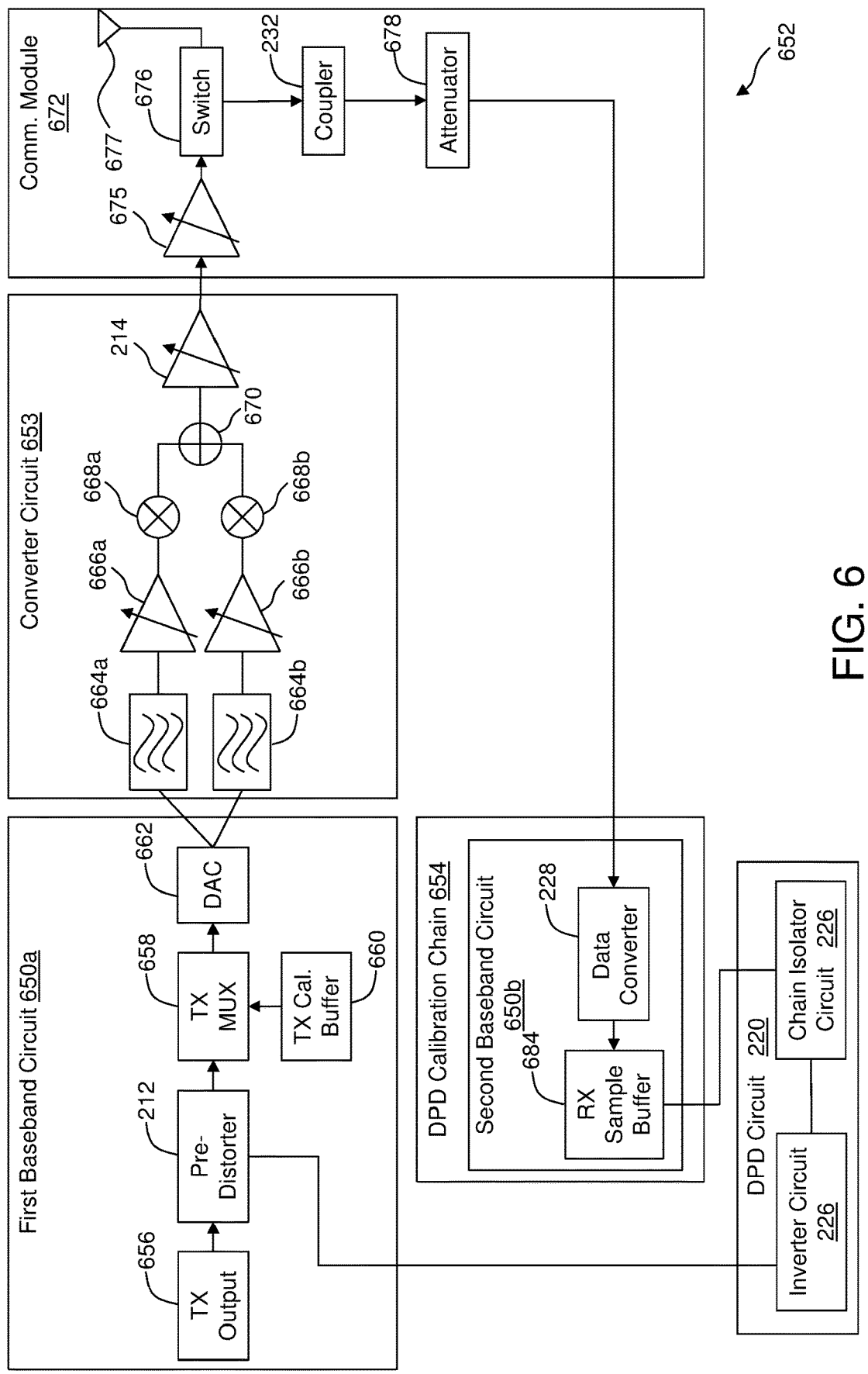
FIG. 6 illustrates an example DPD circuit, DPD calibration chain, and communication chain that may be implemented in the MIMO transceiver of FIG. 1.

FIG. 6 illustrates an example DPD circuit 220, DPD calibration chain 654, and communication chain 652 that may be implemented in the MIMO transceiver 102 of FIG. 1, in accordance with at least one implementation disclosed in the present disclosure. The communication chain 652 may correspond to the communication chains 210 of FIGS. 2-4. Similarly, the DPD calibration chain 654 may correspond to the DPD calibrations chains 218 and 331 of FIGS. 2-4.

The communication chain 652 may include one or more of a first baseband circuit 650a, a converter circuit 653, and/or a communication module 672. The first baseband circuit 650a and the communication module 672 may correspond to the converter circuits 215 and the communication modules 216 of FIGS. 2-4, respectively. The communication chain 652 may transmit calibration signals for performing DPD calibration or signals representative of data to be received by the computing devices 105. Further, the communication chain 652 may be configured to receive signals representative of data from the computing devices 105.

An example of generating and processing of the calibration signals by the communication chain 652 for performing DPD calibration and DPD application will now be discussed. A transmit calibration buffer 660 may receive and buffer an internal calibration signal at the baseband frequency (e.g., the first signal, the second signal, or the third signal). A transmit MUX 658 may selectively provide the internal calibration signal at the baseband frequency or the signals representative of data at the baseband frequency. In particular, the transmit MUX 658 may select output of the transmit calibration buffer 660 or of the pre-distorter circuit 212 to output for further processing. During performance of DPD calibration, the transmit MUX 658 may provide the internal calibration signal at the baseband frequency to a digital to analog converter (DAC) 662. The DAC 662 may convert the internal calibration signal at the baseband frequency from a digital signal to an analog signal (e.g., may generate an internal analog calibration signal). In some implementations, the DAC 662 may generate a first component and a second component of the internal calibration signal. For example, the DAC 662 may include two internal DACs that each generate a different one of the first component and the second component of the internal calibration signal. In these and other implementations, the first and second components of the internal calibration signal may be real and imaginary portions of the internal analog calibration signal.

A first transmit filter 664*a* and a second transmit filter 664*b* (referenced collectively in the present disclosure as "transmit filters 664") may receive the first and second components of the internal calibration signal from the DAC 662, respectively. The transmit filters 664 may be configured to filter out portions of the first and second components of the internal calibration signal. For example, in some implementations, the transmit filters 664 may be configured to filter noise out from the first and second components of the internal calibration signal. In some implementations, the transmit filters 664 may include bandpass filters, lowpass filters, highpass filters, or any other appropriate filter.

A first transmit variable amplifier 666*a* and a second transmit variable amplifier 666*b* (referenced collectively in the present disclosure as "transmit variable amplifiers 666") may receive the first and second components of the internal calibration signal at an initial power level from the transmit filters 664, respectively. The transmit variable amplifiers 666 may be configured to provide a variable gain to the first and second components of the internal calibration signal. The transmit variable amplifiers 666 may amplify the first and second components of the internal calibration signals to a first power level.

A first transmit mixer 668*a* and a second transmit mixer 668*b* (referenced collectively in the present disclosure as "transmit mixers 338") may receive the first and second components of the internal calibration signal at the first power level, respectively. In some implementations, the transmit mixers 668 may also receive a shift signal at a shift frequency. The shift frequency may be equal to a frequency difference of the baseband frequency and the first frequency. The transmit mixers 668 may upconvert the frequency of the first and second components of the internal calibration signal from the baseband frequency to the first frequency using the shift signal. For example, the first transmit mixer 668*a* may upconvert the first component of the internal calibration signal to the first frequency. As another example, the second transmit mixer 668*b* may upconvert the second component of the internal calibration signal to the first frequency. In some embodiments, the first and second components of the internal calibration signal may be upconverted by quadrature components of RF voltage-controlled oscillators (VCOs).

A summer 670 may receive the first and second components of the internal calibration signal at the first frequency and the first power level. The summer 670 may combine the first and second components of the internal calibration signal into the internal analog calibration signal at the first frequency and the first power level. For example, the summer 670 may mix the first and second components of the internal calibration signal into a single RF waveform. The PA 214 may receive and amplify the internal analog calibration signal at the first frequency. For example, the PA 214 may amplify the internal analog calibration signal at the first frequency to a second power level (e.g., may amplify the internal calibration signal at the first frequency to an operational power level of the PA 214). The PA 214 may provide non-linear amplification for which the pre-distortion parameters may be calibrated to compensate for.

An external amplifier 675 may amplify the internal analog calibration signal at the first frequency. For example, the external amplifier 675 may amplify the internal calibration signal at the first frequency to a third power level. In some implementations, the external amplifier 675 may be omitted. In other implementations, the external amplifier 675 may provide variable amplification. When the external amplifier 675 is included and is a PA, DPD calibration may account for nonlinearities introduced by both the PA 214 and the external amplifier 675.

A switch 676 may selectively transition between a transmit position and a receive position. In the transmit position, the communication chain 652 may be in the transmit mode. In the receive position, the communication chain 652 may be in the receive mode. The switch 676 may receive the internal analog calibration signal at the first frequency and the third power level from the external amplifier 675. In addition, the switch 676, in the transmit position, may provide the internal analog calibration signal at the first frequency and the third power level to the coupler 232.

The coupler 232 may provide the internal analog calibration signal at the first frequency and the third power level to an attenuator 678. In some implementations, the attenuator 678 may variably reduce a power level of the internal analog calibration signal at the first frequency. The attenuator 678 may be used to attenuate the internal analog calibration signal to a power level which can fit into a voltage swing of the data converter 228. In some implementations the attenuator 678 may be omitted. For example, the coupler 232 may have enough attenuation built in itself such that its output power level can fit into the voltage swing of the data converter 228 without any further attenuation.

In some implementations, the third power level of the internal analog calibration signal output by the coupler 232 may be determined based on an insertion loss of components in the communication module 672 and/or the DPD calibration chain 654. Amplifying the internal calibration signal to the third power level to compensate for insertion loss of the components in the communication module 672 and/or the DPD calibration chain 654 may cause the receive portion to be configured as a linear receiver.

The data converter circuit 228 may receive the internal calibration signal at the first frequency and the third power level. The data converter circuit 228 may convert the internal calibration signal to a digital signal. In addition, the data converter circuit 228 may sample the internal calibration signal. In some implementations, the data converter circuit 228 may sample the internal calibration signal at the first frequency using the sampling rate based on the baseband frequency. The data converter circuit 228 may generate a sample signal at the baseband frequency and the third power level based on the sampling of the internal calibration signal.

A receive sample buffer 684 may buffer the sample signal. In addition, the receive sample buffer 684 may provide the sample signal at the amplified level (e.g., a buffered sample signal) to the chain isolator circuit 222. The chain isolator circuit 222 and/or the inverter circuit 226 may calibrate the pre-distortion parameters based on the buffered sample signal as discussed above in relation to FIG. 2.

The inverter circuit 226 may provide the pre-distortion parameters to the pre-distorter circuit 212. The pre-distorter circuit 212 may pre-distort subsequent signals based on the pre-distortion parameters. For example, the pre-distorter circuit 212 may pre-distort the signals representative of data received from a transmit output circuit 656. The first baseband circuit 650*a*, the converter circuit 653, and the communication module 672 may process the signals representative of data in the same or similar manner as the calibration signals. In addition, an antenna 677 may receive and wirelessly the signals representative of data to the computing devices 105.

Figure 7:
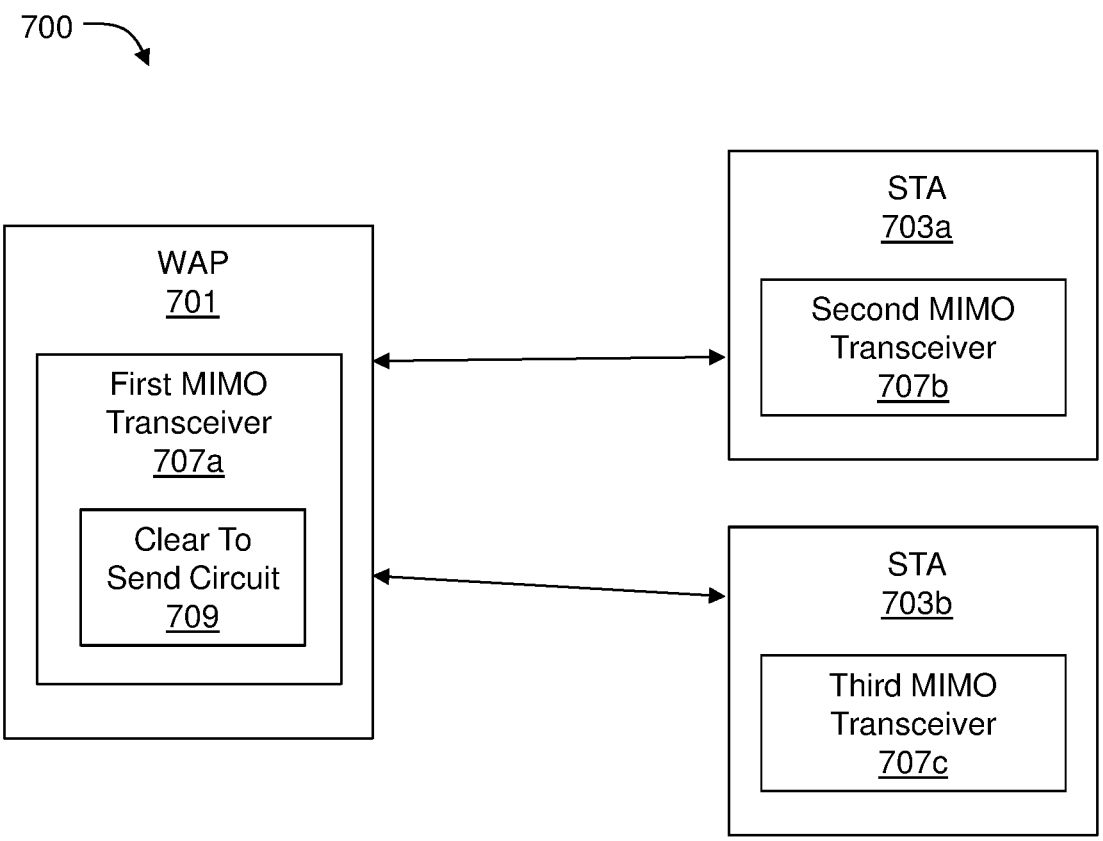
FIG. 7 illustrates an example environment that includes a WAP and wireless stations (STAs)

FIG. 7 illustrates an example environment 700 that includes a WAP 701 and STAs 703*a*, 703*b*, in accordance with at least one implementation disclosed in the present disclosure. Each of the WAP 701 and the STAs 703*a*, 703*b* respectively includes a first MIMO transceiver 707*a*, a second MIMO transceiver 707*b*, or a third MIMO transceiver 707*c* (referred to collectively herein as MIMO transceivers 707). Each of the MIMO transceivers 707 may correspond to the MIMO transceivers 102, 217, 330, and 435 of FIGS. 1-4.

The first MIMO transceiver 707*a* may include a clear-to-send (CTS) circuit 709. Although not illustrated in FIG. 7, either or both of the second and third MIMO transceivers 707*b*, 707*c* may include a similar CTS circuit. The CTS circuit 709 may transmit a CTS-to-self signal. The CTS-to-self signal may reserve a duration of time for the first MIMO transceiver 707*a* to perform DPD using the communication chains 210 (not illustrated in FIG. 7). In some implementations, the CTS-to-self signal may indicate a duration of time that the second MIMO transceiver 707*b*, and/or the third MIMO transceiver 707*c* are not to wirelessly transmit signals at least at the first frequency. Reserving the duration of time for the first MIMO transceiver 707*a* to perform DPD may avoid uplink interference caused by signals transmitted by the second MIMO transceiver 707*b* or the third MIMO transceiver 707*c*.

Figure 8:
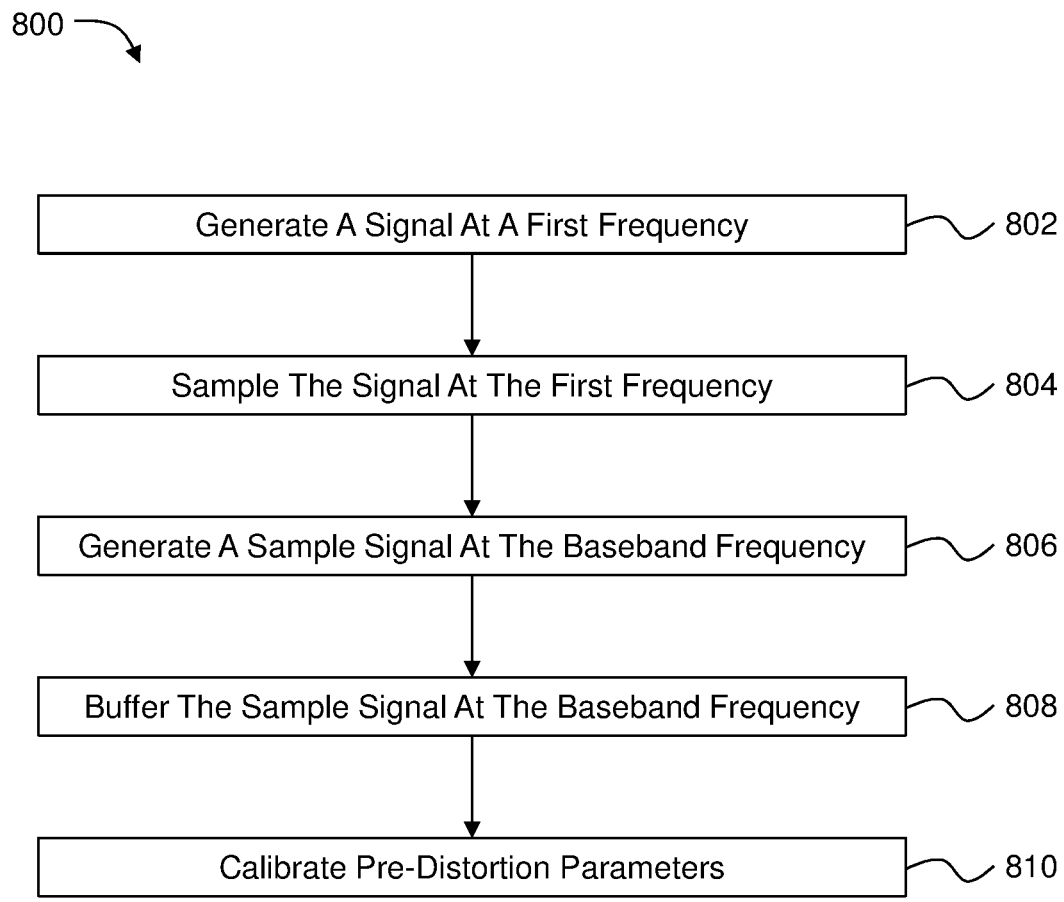
FIG. 8 illustrates a flowchart of an example method of operating a MIMO transceiver, all according to at least one implementation described in the present disclosure.

FIG. 8 illustrates a flowchart of an example method 800 of operating a MIMO transceiver, in accordance with at least one implementation disclosed in the present disclosure. In some implementations, the method of operating the MIMO transceiver may permit DPD for the communication chains to be performed using direct sampling. The method 800 may be performed by any suitable system, apparatus, or device with respect to DPD for the communication chains within the MIMO transceiver. For example, the MIMO transceivers 102, 217, 330, 435, and 707 of FIGS. 1-4 and 7 may perform or direct performance of one or more of the operations associated with the method 800 with respect to DPD for the communication chains 210. Although illustrated with discrete blocks, the steps and operations associated with one or more of the blocks of the method 800 may be divided into additional blocks, combined into fewer blocks, or eliminated, depending on the particular implementation.

The method 800 may include a block 802, at which a signal may be generated at a first frequency. In some implementations, the signal at the first frequency may be generated by a first communication chain of the MIMO transceiver. For example, the signal at the first frequency may be wirelessly transmitted from the first communication module 216*a* of FIG. 2. In these and other implementations, the first communication chain may include a pre-distorter circuit that accepts pre-distortion parameters to pre-distort signals prior to transmission. For example, the first pre-distorter circuit 212*a* of FIG. 2 may accept the first pre-distortion parameters to pre-distort signals prior to transmission. In some implementations, the first communication chain may include a PA that amplifies the signals of the first communication chain prior to transmission. For example, the first PA 214*a* of FIG. 2 may amplify the signals prior to transmission by the first communication module 216*a*.

At block 804, the signal may be sampled at the first frequency. In some implementations, the signal at the first frequency may be sampled using a sampling rate based on a baseband frequency. For example, the signal may be sampled by the first data converter circuit 228*a* of FIG. 2. At block 806, a sample signal may be generated. In some implementations, the sample signal may be generated by the first data converter circuit 228*a* of FIG. 2. At block 808, the sample signal may be buffered at the baseband frequency. For example, the sample signal may be buffered at the baseband frequency by the first buffer 213*a* of FIG. 2.

At block 810, the pre-distortion parameters may be calibrated. In some implementations, the pre-distortion parameters may be calibrated based on the buffered sample signal. In these and other implementations, the pre-distortion parameters may be calibrated to compensate for non-linearity in amplification provided by the PA of the first communication chain. For example, the first pre-distortion parameters may be calibrated by the DPD circuit 220 of FIG. 2 to compensate for non-linearity in amplification provided by the first PA 214*a*.

Modifications, additions, or omissions may be made to the method 800 without departing from the scope of the present disclosure. For example, the operations of method 800 may be implemented in differing order. Additionally or alternatively, two or more operations of the method 800 may be performed at the same time. Furthermore, the outlined operations and actions of the method 800 are only provided as examples, and some of the operations and actions may be optional, combined into fewer operations and actions, or expanded into additional operations and actions without detracting from the essence of the disclosed implementations. In addition, in some implementations, the method 800 may be performed iteratively in which one or more operations may be performed for multiple communication chains in the MIMO transceiver.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of configured operations leading to a desired end state or result. In example implementations, the operations carried out require physical manipulations of tangible quantities for achieving a tangible result.

Unless specifically stated otherwise, as apparent from the discussion, it is appreciated that throughout the description, discussions utilizing terms such as detecting, determining, analyzing, identifying, scanning or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. Such computer-readable media may be any available media that may be accessed by a general-purpose or special-purpose computer. By way of example, such computer-readable media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general-purpose or special-purpose computer. Combinations of the above may also be included within the scope of computer-readable media.

Computer-executable instructions may include, for example, instructions and data which cause a general-purpose computer, special-purpose computer, or special-purpose processing device (e.g., one or more processors) to perform or control performance of a certain function or group of functions. Although the subject matter has been described in language specific to structural features and/or methodological acts, it is to be understood that the subject matter configured in the appended claims is not necessarily limited to the specific features or acts described above. Rather, the specific features and acts described above are disclosed as example forms of implementing the claims.

An example apparatus can include a Wireless Access Point (WAP) or a station and incorporating a VLSI processor and program code to support. An example transceiver couples via an integral modem to one of a cable, fiber or digital subscriber backbone connection to the Internet to support wireless communications, e.g. IEEE 802.11 compliant communications, on a Wireless Local Area Network (WLAN). The WiFi stage includes a baseband stage, and the analog front end (AFE) and Radio Frequency (RF) stages. In the baseband portion wireless communications transmitted to or received from each user/client/station are processed. The AFE and RF portion handles the upconversion on each of transmit paths of wireless transmissions initiated in the baseband. The RF portion also handles the downconversion of the signals received on the receive paths and passes them for further processing to the baseband.

An example apparatus can be a MIMO apparatus supporting as many as N×N discrete communication streams over N antennas. In an example the MIMO apparatus signal processing units can be implemented as N×N. In various implementations, the value of N can be 4, 6, 8, 12, 16, etc. Extended MIMO operation enables the use of up to 2N antennae in communication with another similarly equipped wireless system. It should be noted that extended MIMO systems can communicate with other wireless systems even if the systems do not have the same number of antennae, but some of the antennae of one of the stations might not be utilized, reducing optimal performance.

CSI from any of the communication links described herein can be extracted independent of changes related to channel state parameters and used for spatial diagnosis services of the network such as motion detection, proximity detection, and localization which can be utilized in, for example, WLAN diagnosis, home security, health care monitoring, smart home utility control, elder care, and the like.

Unless specific arrangements described herein are mutually exclusive with one another, the various implementations described herein can be combined to enhance system functionality and/or to produce complementary functions. Such combinations will be readily appreciated by those skilled in the art given the totality of the foregoing description. Likewise, aspects of the implementations may be implemented in standalone arrangements where more limited and thus specific component functionality is provided within each of the interconnected—and therefore interacting—system components albeit that, in sum, they together support, realize and produce the described real-world effect(s). Indeed, it will be understood that unless features in the particular implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will, therefore, be appreciated that the above description has been given by way of example only and that modification in detail may be made within the scope of the present invention.

The subject technology of the present invention is illustrated, for example, according to various aspects described below. Various examples of aspects of the subject technology are described as numbered examples (1, 2, 3, etc.) for convenience. These are provided as examples and do not limit the subject technology. It is noted that any of the dependent examples or portions thereof may be combined in any combination, and placed into an independent example, e.g., Examples 1 and 13. The other examples can be presented in a similar manner. The following is a non-limiting summary of some examples presented herein.

Example 1

A multiple input multiple output (MIMO) transceiver configured for digital pre-distortion (DPD) calibration, the MIMO transceiver comprising:

a first communication chain configured to generate a signal at a first frequency, the first communication chain comprising a pre-distorter circuit configured to accept pre-distortion parameters to pre-distort signals and a power amplifier (PA) configured to amplify the signals of the first communication chain;

a DPD calibration chain configured to receive the signal at the first frequency, the DPD calibration chain comprising:

a data converter configured to perform operations comprising:

sampling the signal at the first frequency using a sampling rate based on a baseband frequency, the baseband frequency being lower than the first frequency; and generating a sample signal at the baseband frequency based on the sampling of the signal;

a buffer configured to buffer the sample signal at the baseband frequency; and a DPD circuit configured to calibrate the pre-distortion parameters based on the buffered sample signal to compensate for non-linearity in amplification provided by the PA of the first communication chain.

Example 2

The MIMO transceiver of example 1, wherein the data converter comprises:

a direct first frequency analog to digital converter (ADC) configured to perform the sampling and generating operations;

a frequency shifter circuit communicatively coupled to the direct first frequency ADC and configured to shift the intermediate frequency of the sample signal received from the direct first ADC to the baseband frequency;

a spectrum inversion circuit communicatively coupled to the frequency shifter circuit and configured to compensate for spectral inversion that occurs in the sample signal received from the frequency shifter circuit;

a finite impulse response (FIR) filter communicatively coupled to the spectrum inversion circuit and configured to filter out of band portions of the sample signal received from the frequency shifter circuit at the baseband frequency; and a down sampler circuit communicatively coupled to the FIR filter and configured to down sample the sample signal received from the FIR filter to a Nyquist sampling rate.

Example 3

The MIMO transceiver of example 1, wherein the data converter comprises:

a Nyquist sampling rate analog to digital converter (ADC) configured to:

sample the signal at the first frequency using the sampling rate based on the baseband frequency; and alias the signal at the first frequency to the sample signal at an intermediate frequency; and a frequency shifter circuit communicatively coupled to the Nyquist sampling rate ADC and configured to shift the intermediate frequency of the sample signal received from the Nyquist sampling rate ADC to the baseband frequency.

Example 4

The MIMO transceiver of example 1, wherein the first communication chain is coupled to a first antenna and the DPD calibration chain is coupled to a second antenna, the second antenna configured to wirelessly receive the signal at the first frequency from the first antenna and the DPD calibration chain configured to receive the signal at the first frequency from the second antenna.

Example 5

The MIMO transceiver of example 1 further comprising a clear to send (CTS) circuit configured to transmit a CTS-to-Self signal to other MIMO transceivers within an operational environment of the MIMO transceiver, the CTS-to-Self signal reserving a duration of time for the MIMO transceiver to perform DPD calibration using the first communication chain and the DPD calibration chain.

Example 6

The MIMO transceiver of example 1, wherein:
the signal comprises a first signal;
the pre-distortion parameters comprise first pre-distortion parameters;
the pre-distorter circuit comprises a first pre-distorter circuit;
the PA comprises a first PA;
the MIMO transceiver further comprises a second communication chain configured to transmit a second signal at the first frequency;
the second communication chain comprises
a second pre-distorter circuit configured to accept second pre-distortion parameters to pre-distort signals; and
a second PA configured to amplify the signals of the second communication chain;

the DPD calibration chain is further configured to receive a combined signal that includes the first signal and the second signal at the first frequency; and the DPD circuit is further configured to:

isolate the first signal and the second signal from the combined signal; and calibrate the second pre-distortion parameters based on the second signal to compensate for non-linearity in amplification provided by the second PA of the second communication chain.

Example 7

The MIMO transceiver of example 1, wherein:
the signal comprises a first signal;
the pre-distortion parameters comprise first pre-distortion parameters;
the pre-distorter circuit comprises a first pre-distorter circuit;
the PA comprises a first PA;
the MIMO transceiver further comprises a second communication chain configured to transmit a second signal at the first frequency;
the second communication chain comprises:
a second pre-distorter circuit configured to accept second pre-distortion parameters to pre-distort signals; and
a second PA configured to amplify the signals of the second communication chain;
the DPD calibration chain is further configured to receive the second signal at the first frequency;
the DPD circuit is further configured to calibrate the second pre-distortion parameters based on the second signal to compensate for non-linearity in amplification provided by the second PA of the second communication chain; and
the MIMO transceiver further comprises a chain selector circuit configured to selectively provide a control signal to the first communication chain and the second communication chain, the control signal indicating which of the first communication chain and the second communication chain are to generate corresponding signals.

Example 8

The MIMO transceiver of example 1, wherein the DPD calibration chain is coupled to a radio frequency (RF) coupler electrically coupled between the PA of the first communication chain and the data converter of the DPD calibration chain, the DPD calibration chain configured to receive the signal at the first frequency from the RF coupler.

Example 9

The MIMO transceiver of example 1, wherein the pre-distorter circuit uses the pre-distortion parameters to compensate for the non-linearity in amplification provided by the PA of the first communication chain by pre-distorting the signals transmitted by the first communication chain equal to an additive inverse of the non-linearity in amplification provided by the PA of the first communication chain.

Example 10

The MIMO transceiver of example 1, wherein the DPD calibration chain is configured as a linear receive chain to avoid distortion of the signal in the DPD calibration chain.

Example 11

The MIMO transceiver of example 1 wherein the DPD circuit is further configured to compare a value of a power level of the buffered sample signal to a value of a power level of an expected signal, the pre-distortion parameters being calibrated based on a difference between the values of the power levels of the buffered sample signal and the expected signal.

Example 12

The MIMO transceiver of example 1 wherein the DPD calibration chain further comprises an attenuator configured to reduce a power level of the signal at the first frequency prior to the data converter sampling the signal.

Example 13

A method to operate a multiple input multiple output (MIMO) transceiver configured for digital pre-distortion (DPD) calibration, the method comprising:
generating, by a first communication chain, a signal at a first frequency, the first communication chain comprising a power amplifier (PA);
sampling, by a DPD calibration chain, the signal at the first frequency using a sampling rate based on a baseband frequency, the baseband frequency being lower than the first frequency;
generating a sample signal at the baseband frequency based on the sampling of the signal;
buffering the sample signal at the baseband frequency; and
calibrating pre-distortion parameters of the first communication chain based on the buffered sample signal to compensate for non-linearity in amplification provided by the PA of the first communication chain.

Calibrating the pre-distortion parameters of the first communication chain may include calibrating predistortion parameters of a pre-distorter circuit of the first communication chain. The pre-distorter circuit may be configured to accept the pre-distortion parameters to pre-distort signals of the first communication chain.

Example 14

The method of example 13, wherein generating the sample signal at the baseband frequency comprises:
generating the sample signal at an intermediate frequency based on the sampling of the signal;
shifting the intermediate frequency of the sample signal to the baseband frequency;
compensating for spectral inversion of the sample signal;
filtering out of band portions of the sample signal at the baseband frequency; and
down sampling the sample signal to a Nyquist sampling rate.

Example 15

The method of example 13, wherein:
sampling the signal at the first frequency comprises aliasing the signal at the first frequency to the sample signal at an intermediate frequency; and
generating the sample signal at the baseband frequency comprises shifting the intermediate frequency of the sample signal to the baseband frequency.

Example 16

The method of example 13, wherein the signal comprises a first signal, the pre-distortion parameters comprise first pre-distortion parameters, the PA comprises a first PA, and the method further comprises:
generating, by a second communication chain, a second signal at the first frequency, the second communication chain comprising a second PA;
receiving, by the DPD calibration chain, a combined signal that includes the first signal and the second signal at the first frequency;
isolating the first signal and the second signal from the combined signal; and
calibrating second pre-distortion parameters of the second communication chain based on the second signal to compensate for non-linearity in amplification provided by the second PA of the second communication chain.

Example 17

The method of example 13 wherein:
the signal comprises a first signal;
the pre-distortion parameters comprise first pre-distortion parameters;
the PA comprises a first PA;
the MIMO transceiver further comprises a second communication chain configured to transmit a second signal at the first frequency, the second communication chain comprising a second PA; and
the method further comprising:
selectively providing a control signal indicating that the second signal is to be generated;
receiving, by the DPD calibration chain, the second signal at the first frequency; and
calibrating second pre-distortion parameters of the second communication chain based on the second signal to compensate for non-linearity in amplification provided by the second PA of the second communication chain.

Example 18

The method of example 13 further comprising transmitting a clear to send (CTS)-to-Self signal to other MIMO transceivers within an operational environment of the MIMO transceiver, the CTS-to-Self signal reserving a duration of time for the MIMO transceiver to perform DPD calibration using the first communication chain and the DPD calibration chain.

Example 19

The method of example 13 wherein calibrating the pre-distortion parameters comprises:
comparing the buffered sample signal to an expected signal; and
calibrating the pre-distortion parameters based on a difference between the buffered sample signal and the expected signal.

Example 20

The method of example 13, wherein the signals are pre-distorted equal to an additive inverse of the non-linearity in amplification provided by the PA of the first communication chain.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described implementations are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A multiple input multiple output (MIMO) transceiver configured for digital pre-distortion (DPD) calibration, the MIMO transceiver comprising:
    a first communication chain configured to generate a signal at a first frequency, the first communication chain comprising a pre-distorter circuit configured to accept pre-distortion parameters to pre-distort signals and a power amplifier (PA) configured to amplify the signals of the first communication chain;
    a DPD calibration chain configured to receive the signal at the first frequency, the DPD calibration chain comprising:
        a data converter configured to perform operations comprising:
            sampling the signal at the first frequency using a sampling rate based on a baseband frequency, the baseband frequency being lower than the first frequency; and
            generating a sample signal at the baseband frequency based on the sampling of the signal;
        a buffer configured to buffer the sample signal at the baseband frequency; and
        a DPD circuit configured to calibrate the pre-distortion parameters based on the buffered sample signal to compensate for non-linearity in amplification provided by the PA of the first communication chain, wherein the first communication chain is coupled to a first antenna and the DPD calibration chain is coupled to a second antenna, the second antenna configured to wirelessly receive the signal at the first frequency from the first antenna and the DPD calibration chain configured to receive the signal at the first frequency from the second antenna.

2. The MIMO transceiver of claim 1, wherein the data converter comprises:
    a direct first frequency analog to digital converter (ADC) configured to perform the sampling and generating operations;
    a frequency shifter circuit communicatively coupled to the direct first frequency ADC and configured to shift an intermediate frequency of the sample signal received from the direct first ADC to the baseband frequency;
    a spectrum inversion circuit communicatively coupled to the frequency shifter circuit and configured to compensate for spectral inversion that occurs in the sample signal received from the frequency shifter circuit;
    a finite impulse response (FIR) filter communicatively coupled to the spectrum inversion circuit and configured to filter out of band portions of the sample signal received from the frequency shifter circuit at the baseband frequency; and
    a down sampler circuit communicatively coupled to the FIR filter and configured to down sample the sample signal received from the FIR filter to a Nyquist sampling rate.

3. The MIMO transceiver of claim 1, wherein the data converter comprises:
    a Nyquist sampling rate analog to digital converter (ADC) configured to:
        sample the signal at the first frequency using the sampling rate based on the baseband frequency; and
        alias the signal at the first frequency to the sample signal at an intermediate frequency; and
    a frequency shifter circuit communicatively coupled to the Nyquist sampling rate ADC and configured to shift the intermediate frequency of the sample signal received from the Nyquist sampling rate ADC to the baseband frequency.

4. The MIMO transceiver of claim 1 further comprising a clear to send (CTS) circuit configured to transmit a CTS-to-Self signal to other MIMO transceivers within an operational environment of the MIMO transceiver, the CTS-to-Self signal reserving a duration of time for the MIMO transceiver to perform DPD calibration using the first communication chain and the DPD calibration chain.

5. The MIMO transceiver of claim 1, wherein:
    the signal comprises a first signal;
    the pre-distortion parameters comprise first pre-distortion parameters;
    the pre-distorter circuit comprises a first pre-distorter circuit;
    the PA comprises a first PA;
    the MIMO transceiver further comprises a second communication chain configured to transmit a second signal at the first frequency;
    the second communication chain comprises:
        a second pre-distorter circuit configured to accept second pre-distortion parameters to pre-distort signals; and
        a second PA configured to amplify the signals of the second communication chain;
    the DPD calibration chain is further configured to receive a combined signal that includes the first signal and the second signal at the first frequency; and
    the DPD circuit is further configured to:
        isolate the first signal and the second signal from the combined signal; and calibrate the second pre-distortion parameters based on the second signal to compensate for non-linearity in amplification provided by the second PA of the second communication chain.

6. The MIMO transceiver of claim 1, wherein:
the signal comprises a first signal;
the pre-distortion parameters comprise first pre-distortion parameters;
the pre-distorter circuit comprises a first pre-distorter circuit;
the PA comprises a first PA;
the MIMO transceiver further comprises a second communication chain configured to transmit a second signal at the first frequency;
the second communication chain comprises:
  a second pre-distorter circuit configured to accept second pre-distortion parameters to pre-distort signals; and
  a second PA configured to amplify the signals of the second communication chain;
the DPD calibration chain is further configured to receive the second signal at the first frequency;
the DPD circuit is further configured to calibrate the second pre-distortion parameters based on the second signal to compensate for non-linearity in amplification provided by the second PA of the second communication chain; and
the MIMO transceiver further comprises a chain selector circuit configured to selectively provide a control signal to the first communication chain and the second communication chain, the control signal indicating which of the first communication chain and the second communication chain are to generate corresponding signals.

7. The MIMO transceiver of claim 1, wherein the DPD calibration chain is coupled to a radio frequency (RF) coupler electrically coupled between the PA of the first communication chain and the data converter of the DPD calibration chain, the DPD calibration chain configured to receive the signal at the first frequency from the RF coupler.

8. The MIMO transceiver of claim 1, wherein the pre-distorter circuit uses the pre-distortion parameters to compensate for the non-linearity in amplification provided by the PA of the first communication chain by pre-distorting the signals transmitted by the first communication chain equal to an additive inverse of the non-linearity in amplification provided by the PA of the first communication chain.

9. The MIMO transceiver of claim 1, wherein the DPD calibration chain is configured as a linear receive chain to avoid distortion of the signal in the DPD calibration chain.

10. The MIMO transceiver of claim 1 wherein the DPD circuit is further configured to compare a value of a power level of the buffered sample signal to a value of a power level of an expected signal, the pre-distortion parameters being calibrated based on a difference between the values of the power levels of the buffered sample signal and the expected signal.

11. The MIMO transceiver of claim 1 wherein the DPD calibration chain further comprises an attenuator configured to reduce a power level of the signal at the first frequency prior to the data converter sampling the signal.

12. A method to operate a multiple input multiple output (MIMO) transceiver configured for digital pre-distortion (DPD) calibration, the method comprising:
generating, by a first communication chain, a signal at a first frequency, the first communication chain comprising a power amplifier (PA);
sampling, by a DPD calibration chain, the signal at the first frequency using a sampling rate based on a baseband frequency, the baseband frequency being lower than the first frequency;
generating a sample signal at the baseband frequency based on the sampling of the signal;
buffering the sample signal at the baseband frequency; and
calibrating pre-distortion parameters of the first communication chain based on the buffered sample signal to compensate for non-linearity in amplification provided by the PA of the first communication chain,
wherein:
  sampling the signal at the first frequency comprises aliasing the signal at the first frequency to the sample signal at an intermediate frequency; and
  generating the sample signal at the baseband frequency comprises shifting the intermediate frequency of the sample signal to the baseband frequency.

13. A method to operate a multiple input multiple output (MIMO) transceiver configured for digital pre-distortion (DPD) calibration, the method comprising:
generating, by a first communication chain, a signal at a first frequency, the first communication chain comprising a power amplifier (PA);
sampling, by a DPD calibration chain, the signal at the first frequency using a sampling rate based on a baseband frequency, the baseband frequency being lower than the first frequency;
generating a sample signal at the baseband frequency based on the sampling of the signal;
buffering the sample signal at the baseband frequency; and
calibrating pre-distortion parameters of the first communication chain based on the buffered sample signal to compensate for non-linearity in amplification provided by the PA of the first communication chain,
wherein generating the sample signal at the baseband frequency comprises:
  generating the sample signal at an intermediate frequency based on the sampling of the signal;
  shifting the intermediate frequency of the sample signal to the baseband frequency;
  compensating for spectral inversion of the sample signal;
  filtering out of band portions of the sample signal at the baseband frequency; and
  down sampling the sample signal to a Nyquist sampling rate.

14. The method of claim 12, wherein the signal comprises a first signal, the pre-distortion parameters comprise first pre-distortion parameters, the PA comprises a first PA, and the method further comprises:
generating, by a second communication chain, a second signal at the first frequency, the second communication chain comprising a second PA;
receiving, by the DPD calibration chain, a combined signal that includes the first signal and the second signal at the first frequency;
isolating the first signal and the second signal from the combined signal; and
calibrating second pre-distortion parameters of the second communication chain based on the second signal to compensate for non-linearity in amplification provided by the second PA of the second communication chain.

15. The method of claim 12 wherein:
the signal comprises a first signal;

the pre-distortion parameters comprise first pre-distortion parameters;

the PA comprises a first PA;

the MIMO transceiver further comprises a second communication chain configured to transmit a second signal at the first frequency, the second communication chain comprising a second PA; and the method further comprising:
- selectively providing a control signal indicating that the second signal is to be generated;
- receiving, by the DPD calibration chain, the second signal at the first frequency; and
- calibrating second pre-distortion parameters of the second communication chain based on the second signal to compensate for non-linearity in amplification provided by the second PA of the second communication chain.

16. The method of claim 12, further comprising transmitting a clear to send (CTS)-to-Self signal to other MIMO transceivers within an operational environment of the MIMO transceiver, the CTS-to-Self signal reserving a duration of time for the MIMO transceiver to perform DPD calibration using the first communication chain and the DPD calibration chain.

17. The method of claim 12, wherein calibrating the pre-distortion parameters comprises:
- comparing the buffered sample signal to an expected signal; and
- calibrating the pre-distortion parameters based on a difference between the buffered sample signal and the expected signal.

18. The method of claim 12, wherein the signals are pre-distorted equal to an additive inverse of the non-linearity in amplification provided by the PA of the first communication chain.

19. The method of claim 13, further comprising transmitting a clear to send (CTS)-to-Self signal to other MIMO transceivers within an operational environment of the MIMO transceiver, the CTS-to-Self signal reserving a duration of time for the MIMO transceiver to perform DPD calibration using the first communication chain and the DPD calibration chain.

20. The method of claim 13, further comprising wirelessly transmitting the signal at the first frequency from a first antenna coupled to the first communication chain to a second antenna coupled to the DPD calibration chain.

* * * * *